US007027235B2

(12) United States Patent
Koehler

(10) Patent No.: US 7,027,235 B2
(45) Date of Patent: Apr. 11, 2006

(54) OPTICAL SYSTEM FOR PROVIDING A USEFUL LIGHT BEAM INFLUENCED BY POLARIZATION

(75) Inventor: Jess Koehler, Immenstaad (DE)

(73) Assignee: Carl Zeiss SMT AG, Oberkochen (DE)

( * ) Notice: Subject to any disclaimer, the term of this patent is extended or adjusted under 35 U.S.C. 154(b) by 13 days.

(21) Appl. No.: 10/728,814

(22) Filed: Dec. 8, 2003

(65) Prior Publication Data

US 2004/0169937 A1    Sep. 2, 2004

(30) Foreign Application Priority Data

Dec. 6, 2002   (DE)   ............... 102 58 732

(51) Int. Cl.
*G02B 5/30* (2006.01)
*G02B 17/00* (2006.01)

(52) U.S. Cl. .................... 359/726; 359/501

(58) Field of Classification Search ........... 359/726, 359/501
See application file for complete search history.

(56) References Cited

U.S. PATENT DOCUMENTS 5,386,317 A * 1/1995 Corle et al. ............. 359/386

| 5,475,491 | A | 12/1995 | Shiozawa |
| 6,252,712 | B1 | 6/2001 | Furter et al. |
| 2002/0167734 | A1 | 11/2002 | Schuster |
| 2002/0191288 | A1 | 12/2002 | Gruner et al. |

FOREIGN PATENT DOCUMENTS

| DE | 198 07 120 A1 | 8/1999 |
| DE | 198 51 749 A1 | 5/2000 |
| DE | 101 17 481 A1 | 10/2002 |
| DE | 101 24 474 A1 | 11/2002 |

* cited by examiner

*Primary Examiner*—Scott J. Sugarman
(74) *Attorney, Agent, or Firm*—Sughrue Mion, PLLC

(57) ABSTRACT

An optical system for providing a useful light beam, having one or more optical components (3, 4, 5) which attenuate a useful light fraction with a first linear polarization state less strongly than a useful light fraction with a second linear polarization state different from the first state. A compensation unit is provided which includes a transmission plate (9) that is introduced into the useful light beam path (7) inclined ($\beta$) to the optical axis, and attenuates the useful light fraction with the first linear polarization state more strongly than that with the second linear polarization state. As a result, the imbalance, caused by the system without a compensation unit, of the two useful light fractions can be compensated completely or in any case partially. The optical system is used, for example, in illuminating systems and projection objectives of microlithographic projection exposure apparatuses.

7 Claims, 3 Drawing Sheets

OPTICAL SYSTEM FOR PROVIDING A USEFUL LIGHT BEAM INFLUENCED BY POLARIZATION

The following disclosure is based on German Patent Application No. 102 58 732.9 filed on Dec. 6, 2002, which is incorporated into this application by reference.

BACKGROUND OF THE INVENTION

1. Field of the Invention

The invention relates to an optical system for providing a useful light beam influenced by polarization. The invention relates, more particularly, to optical systems which provide a useful light beam for wafer exposure in microlithographic projection exposure machines.

2. Description of the Related Art

In the named specific application of wafer exposure, one or more deflecting mirrors are frequently used in the optical system, which is typically composed of an illuminating system upstream of the reticle plane or mask plane, and a projection objective between the reticle plane and wafer plane. As is known, p-polarized light, that is to say light polarized linearly parallel to the plane of incidence, is attenuated more strongly in the case of reflection at a deflecting mirror than is s-polarized light, that is to say light polarized linearly perpendicular to the plane of incidence. On the other hand, it is desirable in conjunction with high requirements placed on the imaging quality that the p-component and the s-component of the illuminating light are as equal as possible in the wafer plane.

This problem is addressed, for example, in the Laid-Open Patent Application DE 198 51 749 A1 for the case of a catadioptric objective with a plurality of deflecting mirrors, the latter also to be understood in the present case as appropriate deflecting prisms. It is proposed there as a remedy to arrange the deflecting mirrors in a compensated fashion independently of polarization, specifically with planes of incidence which are not parallel, and, in particular, perpendicular to one another. This remedial measure is, however, suitable only for systems having a plurality of deflecting mirrors, and the design of the illuminating system and projection objective in the overall optical system does not always permit such an arrangement of deflecting mirrors with non-parallel planes of incidence. The measure proposed there as an alternative, of providing the at least one deflecting mirror of an objective with a thin, polarization-specific layer, in particular a phase-correcting dielectric layer, can be implemented only with difficulty for applications with large beam divergences and short wavelengths.

U.S. Pat. No. 5,475,491 discloses an exposure system in which a fraction of the light generated by a laser, for example, is coupled out to a photodetector at a semi-transmitting mirror by means of reflection, while the light fraction transmitted by the semi-transmitting mirror forms the useful light beam for exposure. The exact exposure dose is to be detected by the detector. Since, however, the respective degree of reflection and transmission of the semi-transmitting mirror differs for the s-polarized component and the p-polarized component, the detector result cannot be used directly to infer the true exposure dose when the polarization state of the incoming light is not known or varies upstream of the deflecting mirror. As a remedy, a plane transmission plate is introduced obliquely relative to the optical axis with an adjustable angle of inclination into the beam path of the coupled-out detection light between the deflecting mirror and detector. This angle of inclination is then set, as a function of the degree of transmission and reflection of the semi-transmitting mirror, for s- or p-polarized light such that the light intensity arriving at the detector is always proportional, independently of the possibly varying s-polarized or p-polarized light fractions, to the intensity of the useful light transmitted by the semi-transmitting mirror. The relative fractions for the s- and p-components of the useful light are not fixed thereby and can vary as desired depending on the design of the system part upstream of the semi-transmitting mirror.

SUMMARY OF THE INVENTION

The invention is based on the technical problem of providing an optical system of the type mentioned at the beginning which is capable of making available a useful light beam having light fractions that are the same or in any case differ comparatively little, of two different linear polarization states even when the light supplied by an associated light source already has a marked imbalance of these light fractions, or such an imbalance is caused by one or more other system components, such as, for example, deflecting mirrors.

According to one formulation of the invention, this problem is solved by providing an optical system including a compensation unit having at least one transmission plate which is inclined to the optical axis and is introduced into the light beam path. The effect of the oblique position is that the plate attenuates the light fraction with a first linear polarization state, for example, s-polarized light, more strongly in transmission than the light fraction with a second linear polarization state differing therefrom, for example, p-polarized light. This is utilized according to the invention for the purpose of completely or in any case partially compensating an imbalance of the two useful light fractions which is caused by the system without the compensation unit, for example, by deflecting mirrors.

In a development of the invention the transmission plate includes a transparent plate which is provided with a transmitting coating. With the aid of a suitably selected coating, the effect that the useful light fraction with the first linear polarization state is attenuated to an extent dependent on the light incidence angle more strongly than the useful light fraction with the second linear polarization state can be achieved or amplified in a desired way.

In a further development of the invention the system has one or more deflecting mirrors which cause the imbalance of the two useful light fractions. The inclination angle and/or the coating of the transmission plate are selected as a function of the magnitude of this imbalance, preferably for the purpose of complete compensation. Further, a measuring device for determining the polarization degree can be provided in the beam path downstream of the deflecting mirror or mirrors and can be used to measure the imbalance of the two useful light fractions, in order suitably to control the inclination angle or the coating as a function of the measurement result, if required even also subsequently after a specific pre-setting has previously been selected. A further refinement of this measure is based on an imaging system, as an optical system, in which the transmission plate and a deflecting mirror are arranged at least approximately in planes of the imaging system which are conjugate to one another. Consequently, light incidence conditions similar to one another, in particular, incidence angle distributions, are present for the transmission plate, on the one hand, and the deflecting mirror, on the other hand, and this facilitates a possibly spatially dependent polarization compensation.

Given a non-constant incidence angle distribution of the useful light incident on a deflecting mirror of the system, the result is a correspondingly spatially dependent imbalance of the two useful light fractions with a different linear polarization state. A refinement of the invention also permits for this case a substantially complete compensation of this imbalance by virtue of the fact that the coating is correspondingly applied to the transparent plate in a spatially dependent variable manner.

Another development of the invention is likewise based on an imaging system as the optical system. In this case, the compensation unit has a second transmission plate which is introduced into the useful light beam path in an oblique fashion relative to the optical axis, with an inclination angle which is opposite to that of the other transmission plate. It is possible thereby to compensate, completely or partially, asymmetric aberrations which are caused by the oblique introduction of one transmission plate into the imaging system. For the purpose of a substantially complete compensation, it is expedient for both transmission plates to be of the same dimensions and to be arranged with opposite inclination angles of the same size.

BRIEF DESCRIPTION OF THE DRAWINGS

Advantageous embodiments of the invention are illustrated in the drawings and described below. In the drawings.

DETAILED DESCRIPTION OF PREFERRED EMBODIMENTS

Figure 1:
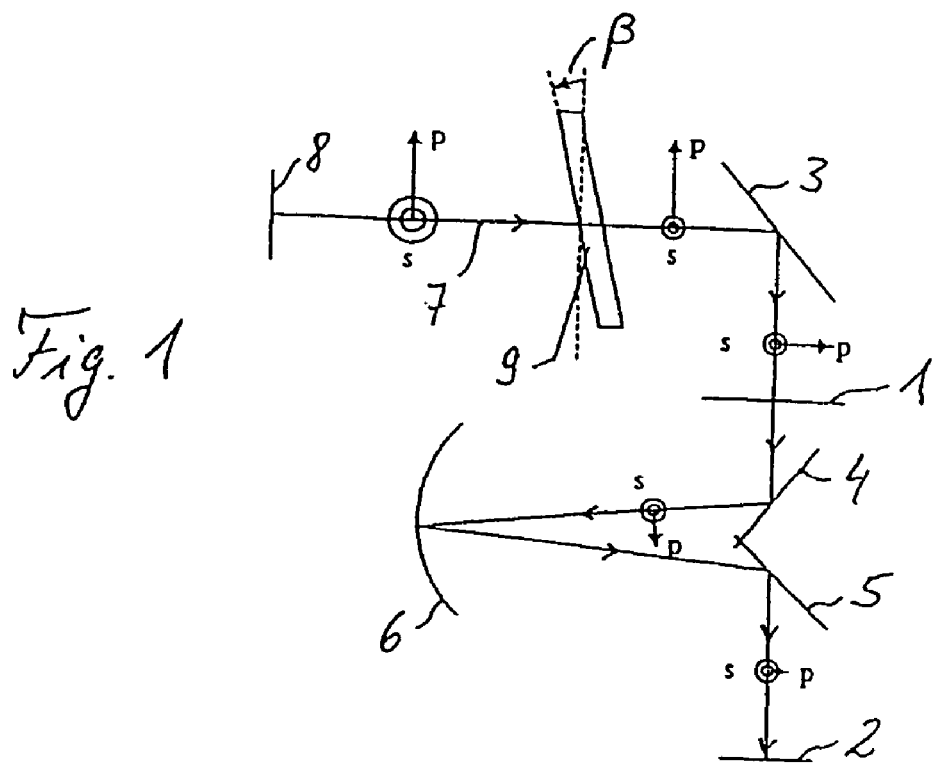
FIG. 1 shows a diagrammatic side view of a part of an optical system for a microlithographic projection exposure apparatus.

FIG. 1 illustrates diagrammatically the problem of the different attenuation of s-polarized light and p-polarized light by deflecting mirrors, and the elimination of the imbalance, caused thereby, of the intensity of s- and p-polarized components, with reference to the example of an optical imaging system for a microlithographic projection exposure apparatus. Such an imaging system is known to consist of an illuminating system upstream of a reticle/mask plane 1, for the purpose of providing light for trans-luminating a mask inserted there, and of a projection objective between the reticle plane 1 and wafer plane 2 for the purpose of projecting the mask structure onto a wafer inserted into the wafer plane 2. Deflecting mirrors are present, e.g. for the purpose of achieving a compact system design, in the illuminating system and/or in the projection objective, depending on system design.

A first deflecting mirror 3 is provided in the illuminating system, and two deflecting mirrors 4, 5 are provided, as 45° deflecting mirrors in each case, in the projection objective in the example of FIG. 1. The two deflecting mirrors 4, 5 serve the purpose in the projection objective of, for example, implementing a catadioptric design, indicated diagrammatically by a reflecting mirror 6. The remaining system components such as lenses, etc. are omitted in FIG. 1 for the sake of clarity, since they play no role with regard to the different attenuation of s- and p-polarized light.

The three deflecting mirrors 3, 4, 5 are arranged such that the normals to their planes all lie in one plane, the plane of the drawing of FIG. 1. Also lying in this plane is the optical axis of the system, represented by a main light beam 7 which is shown representatively for the entire light beam bundle. This plane therefore forms a common incidence plane for all three deflecting mirrors, 3, 4, 5. The relative amplitudes or intensity fractions of s-polarized light, that is to say light polarized perpendicular to the incidence plane, and of light polarized perpendicular thereto, that is to say p-polarized light, are illustrated, as is customary, by the length of an arrow belonging to p-polarized light, and the diameter of a double circle belonging to s-polarized light.

As may be seen from FIG. 1, it can be assumed without restricting generality that the light on the output side of a diaphragm 8 of the illuminating system has fractions of s- and p-polarized light of the same size. Moreover, it may be seen from a comparison of incident and reflected light that each deflecting mirror 3, 4, 5 deflects the p-polarized light fraction with a distinctly stronger attenuation by comparison with the s-polarized light fraction (shortening of the associated p arrows accompanied by a substantially constant diameter of the s circles in FIG. 1). Consequently, without further measures, the useful light provided on the wafer plane 2 would contain a p-polarized light fraction distinctly reduced by comparison with the s-polarized fraction.

In order to avoid this imbalance of s- and p-polarized light fractions, there is introduced into the beam path of the useful light 7 a compensation element in the form of a transmission plate 9 which is preferably implemented as a plane plate coated at least on one side. The transmission plate 9 is likewise arranged with the normal to the plane lying in the incidence plane, it being inclined with its plane by a prescribable angle of inclination β with reference to the plane perpendicular to the optical axis. In other words, the transmission plate 9 is tilted with reference to this plane about the axis parallel to the direction of s-polarization. This arrangement of the transmission plate 9 obliquely relative to the optical axis 7 has the consequence that the s-polarized fraction of the light passing through it is markedly attenuated, while the p-polarized light fraction passes through in a substantially less attenuated fashion.

The material and the dimensioning of the transmission plate 9 and, specifically, of the coating, particularly as regards their refractive index and their thickness, and the angle of inclination β are selected as a function of the magnitude of the imbalance, existing without the transmission plate 9, of s- and p-polarized light such that the degree of relative attenuation of the s-polarized light by the transmission plate 9 corresponds entirely or in any case largely to the extent of relative attenuation of the p-polarized light by the deflecting mirrors 3, 4, 5. Correspondingly, the imbalance, caused by the deflecting mirrors 3, 4, 5, of s- and p-polarized light is completely or in any case partially compensated by the transmission plate 9. Overcompensation is also possible if required. The imbalance can be detected, for example, by means of a conventional measuring device for determining the degree of polarization, which is arranged downstream of the last deflecting mirror 5 in the beam path.

The angle of inclination β and/or the coating are then set in a desired way depending on the measurement result, and readjusted if required.

Correspondingly, the optical system equipped with the transmission plate 9 makes available a useful light beam, here for the purpose of wafer exposure, whose s-polarized light fraction can be set to a desired extent relative to the p-polarized light fraction, whereby attenuation of the p-polarized light fraction which is caused by deflecting mirrors or other system components is exactly compensated, under or over compensated depending on application. The compensation effect of the transmission plate 9 can be influenced specifically, during its fabrication, by the selection of material and by the type and thickness of a coating which is optionally applied, this, if required, being performed variably depending on location. During use of the transmission plate 9, the compensation effect can be set to a respectively desired value by the selection of an appropriate angle of inclination β.

Figure 2:
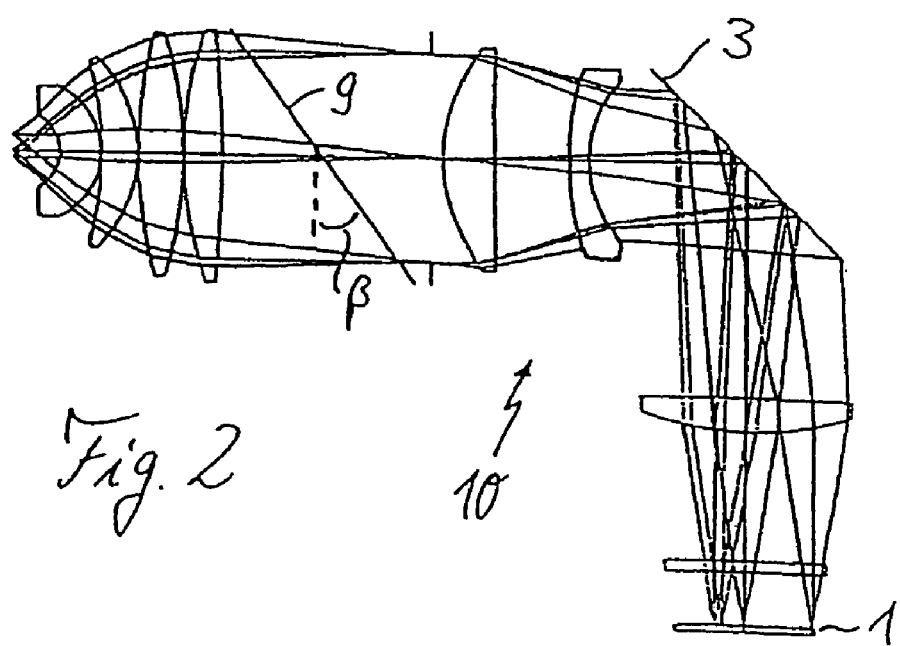
FIG. 2 shows a longitudinal sectional view of an objective for an illuminating system of a microlithographic projection exposure apparatus.

FIG. 2 shows an exemplary embodiment, implemented in practice, in the form of an objective 10 which is used in an illuminating system in accordance with FIG. 1 and is also denoted as an ReMa objective, and includes the first deflecting mirror 3 of FIG. 1, on the illuminating system side, and the transmission plate 9. With the exception of the additional transmission plate 9, this objective has a conventional design consisting of diverse, diagrammatically reproduced optics components, in particular lenses and diaphragms, as well as the deflecting mirror 3, the optical action of which components is rendered clear with the aid of the illustrated beam paths, and which do not require any kind of more detailed explanation here. The transmission plate 9 and the deflecting mirror 3 are preferably arranged approximately at the level of conjugate planes of the objective 10. This results in similar incidence angle distributions for the transmission plate 9 and the deflecting mirror 3, such that a coating which is spatially uniform over the entire transluminated surface of the transmission plate 9, suffices to achieve a uniform, preferably complete compensation of the imbalance of s- and p-polarized light fractions at all field points of the overall field region of the objective 10.

When the incidence angle distributions are not so similar that it is possible to achieve the desired compensation at all field points with the aid of a uniform plane plate coating, it is alternatively possible to provide a spatially variable coating for the transmission plate 9, doing so in such a way that the local variation of the coating at each field point corresponds to the variation of the incidence angle distribution, that is to say for each field point, the transmission plate 9 compensates the location-dependent attenuation, caused by the deflecting mirror 3, of the p-polarized light fraction by means of a location-dependent attenuation, preferably of the same magnitude, of the s-polarized light fraction. A similar statement holds for the case in which the transmission plate 9 has to compensate the attenuation effect of a plurality of deflecting mirrors, as in the example of FIG. 1. Alternatively, each deflecting mirror can respectively be assigned a transmission plate introduced obliquely.

The quantitative determination of the parameters of the transmission plate 9, in particular as regards the coating and the angle of inclination β, in relation to the compensation, explained above, of the imbalance, caused by the deflecting mirror 3, of s- and p-polarization fractions in the useful light beam path is explained below with reference to FIGS. 3 to 5.

Figure 3:
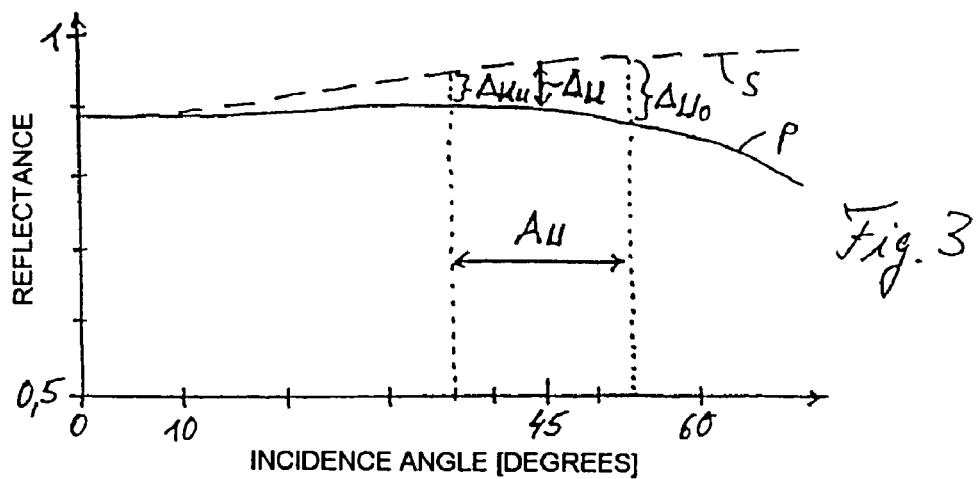
FIG. 3 shows a characteristic diagram of reflectance as a function of incidence angle for a deflecting mirror used in the objective of FIG. 2.

FIG. 3 shows the typical variation of the characteristics of the reflectance of a deflecting mirror such as the deflecting mirror 3 of FIGS. 1 and 2, as a function of the incidence angle for p-polarized light (continuous characteristic curve), on the one hand, and s-polarized light (dashed characteristic curve), on the other hand. A typical operating range $A_U$ for a 45° deflecting mirror is given between the dotted boundaries. In this example, the incidence angles are distributed between approximately 36° and 54° about the mean value of 45°. As may be seen from FIG. 3, the difference between the reflectance for s-polarized light and that for p-polarized light rises continuously with the increasing incidence angle, and thus also does the difference in the polarization attenuation of p-polarized light relative to s-polarized light. Over the operating range $A_U$, this difference in the reflectance and thus in the polarization attenuation increases from a minimum value $\Delta_{Uu}$ up to maximum value $\Delta_{Uo}$ with a mean value of $\Delta_U$ for the mean incidence angle of 45°.

Figure 4:
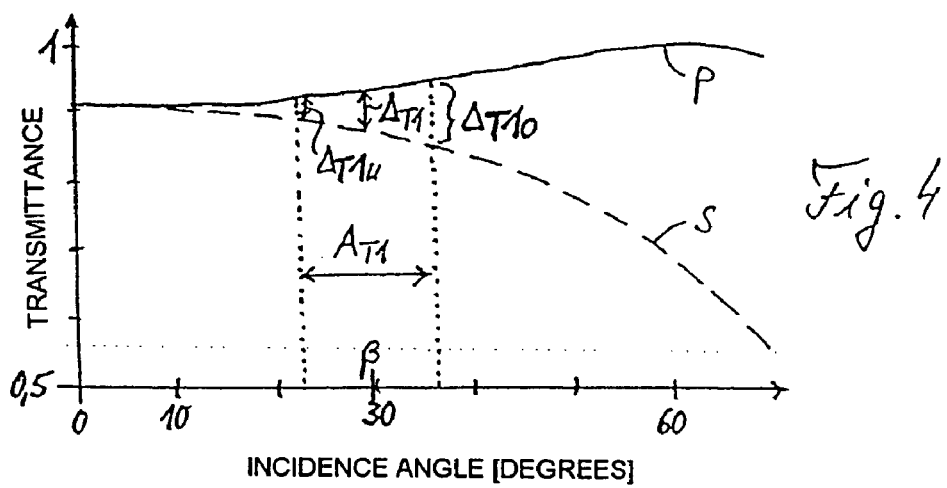
FIG. 4 shows a characteristic diagram of transmittance as a function of incidence angle for a first implementation of a transmission plate inserted into the objective of FIG. 2.

FIG. 4 shows transmittance as a function of incidence angle for an implementation of the transmission plate 9 as a plane plate which is provided with a coating which has a thickness of 30 nm and a refractive index of 1.45, specifically, in turn, for p-polarized light (continuous characteristic curve), on the one hand, and s-polarized light (dashed characteristic curve), on the other hand. As may be seen therefrom, the transmittance decreases continuously for s-polarized light in the range considered, while for p-polarized light it even slightly increases at first, that is to say the transmission plate 9 attenuates the s-polarized light fraction ever more strongly relative to the p-polarized light fraction with an increasing incidence angle in the incidence angle range considered.

It is therefore always possible to find an operating range $A_{T1}$, indicated in FIG. 4 by dotted boundaries, for the transmission plate 9, which leads to as complete a compensation as possible of the polarization imbalance, caused by the deflecting mirror 3, for the incidence angles occurring here. Firstly, the angle of inclination β is determined for this purpose such that the difference $\Delta_{T1}$ resulting for it in the transmittance of the transmission plate 9, and thus in its attenuation of the polarization of p- and s-polarized light corresponds to the difference $\Delta_U$ in the reflectance of the deflecting mirror 3, and thus, in the polarization attenuation thereof of s- and p-polarized light given a selected tilting angle of 45°, which is the mean incidence angle. The transmission plate 9 is introduced into the useful light beam path with this angle of inclination β of approximately 30°, in this case.

When the transmission plate 9 and deflecting mirror 3 lie in conjugate planes of the objective of FIG. 2, the transmission plate operating range $A_{T1}$ about the angle of inclination β corresponds to the deflecting mirror operating range $A_U$, this operating range $A_{T1}$ ranging from approximately 24° to approximately 36° in the example of FIG. 4 shown. The minimum difference $\Delta_{T1u}$ and maximum difference $\Delta_{T1o}$, resulting for this operating range $A_{T1}$, in the polarization attenuation through the transmission plate 9 then likewise corresponds in absolute value to a very large extent to the relative minimum attenuation value $\Delta_{Uu}$ or the maximum attenuation value $\Delta_{Uo}$ of the deflecting mirror 3. This makes it plain that here a uniform coating of the transmission plate 9 suffices for a compensation, uniform over the entire relevant image field of the objective, of the different attenuation of s- and p-polarized light owing to the deflecting mirror 3. This holds specifically when the incidence angles at the various points of the deflecting mirror 3 are largely equal, so that then the difference in polarization attenuation, induced by the deflecting mirror 3, for s-polarized light or p-polarized light is approximately constant in the relevant plane.

In the event of variations in the incidence angle distribution and/or in the event of a deviation of the position of the transmission plate 9 from a plane conjugate to the deflecting mirror or mirrors 3, a compensation being to a very large extent uniform and complete over the entire image field can be achieved by virtue of the fact that the coating is applied to the plane plate in a correspondingly different, spatially variable fashion, in particular as regards its thickness and/or its material.

Figure 5:
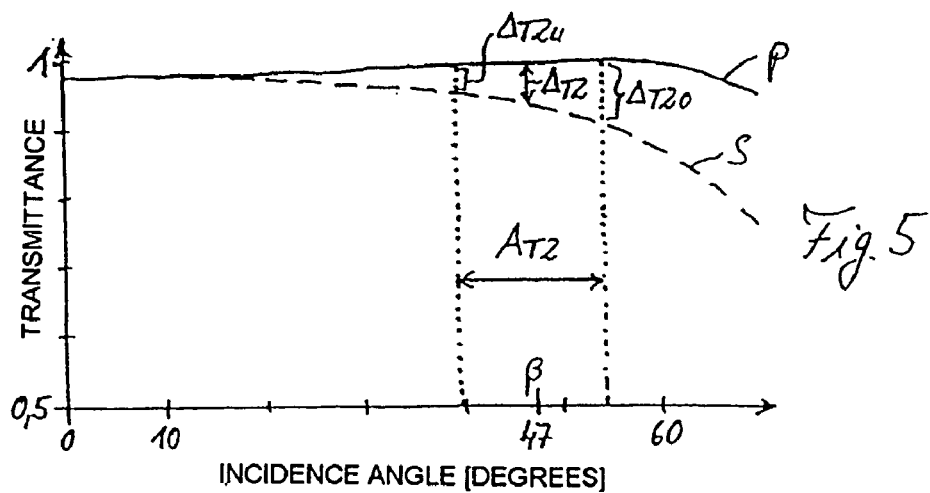
FIG. 5 shows a characteristic diagram corresponding to FIG. 4 but for a second implementation of the transmission plate.

FIG. 5 illustrates the dependence of the transmittance on the incidence angle for a second implementation of the transmission plate 9 in the form of a plane plate with a coating which has a thickness of 30 nm and a refractive index of 1.65, once again for p-polarized light (continuous characteristic curve), on the one hand, and for s-polarized light (dashed characteristic curve), on the other hand. Qualitatively, the forms of the characteristic curves correspond to those of FIG. 4, but the difference between p- and s-polarized light is less for the same incidence angle. Consequently, the result in this case is a larger angle of inclination β of approximately 47°, for which the relative attenuation difference $\Delta_{T2}$ corresponds in terms of absolute magnitude to the mean polarization attenuation difference $\Delta_U$ of the deflecting mirror 3. In this case, a transmission plate operating range $A_{T2}$ from approximately 40° to approximately 54° corresponds to the deflecting mirror operating range $A_U$. Once again, the minimum polarization attenuation difference $\Delta_{T2u}$ and the maximum polarization attenuation difference $\Delta_{T2o}$, resulting therefrom, as they are given by this transmission plate operating range $A_{T2}$ correspond to a very large extent in absolute value to, respectively, the minimum and maximum polarization attenuation difference $\Delta_{Uu}$, $\Delta_{Uo}$ of the deflecting mirror 3.

The introduction of the tilted transmission plate 9 into an imaging system such as the imaging objective of FIG. 2 can produce aberrations which are not rotationally symmetrical in relation to the optical axis, and can therefore not be compensated straight away by the lens elements of the system. If the transmission plate is relatively thin, these aberrations may be negligible. In order to compensate the asymmetric aberrations in the case, in particular, when use is made of a transmission plate of marked thickness, it is possible to introduce into the useful light beam path a further transmission plate of the same dimension which, by comparison with the plane perpendicular to the optical axis, is inclined about the same axis, but in a fashion opposite to the other, first transmission plate. Both plates are preferably separated only by an air gap. It is preferred, but not mandatory for the two angles of inclination to be selected with the same absolute magnitude.

Figure 6:
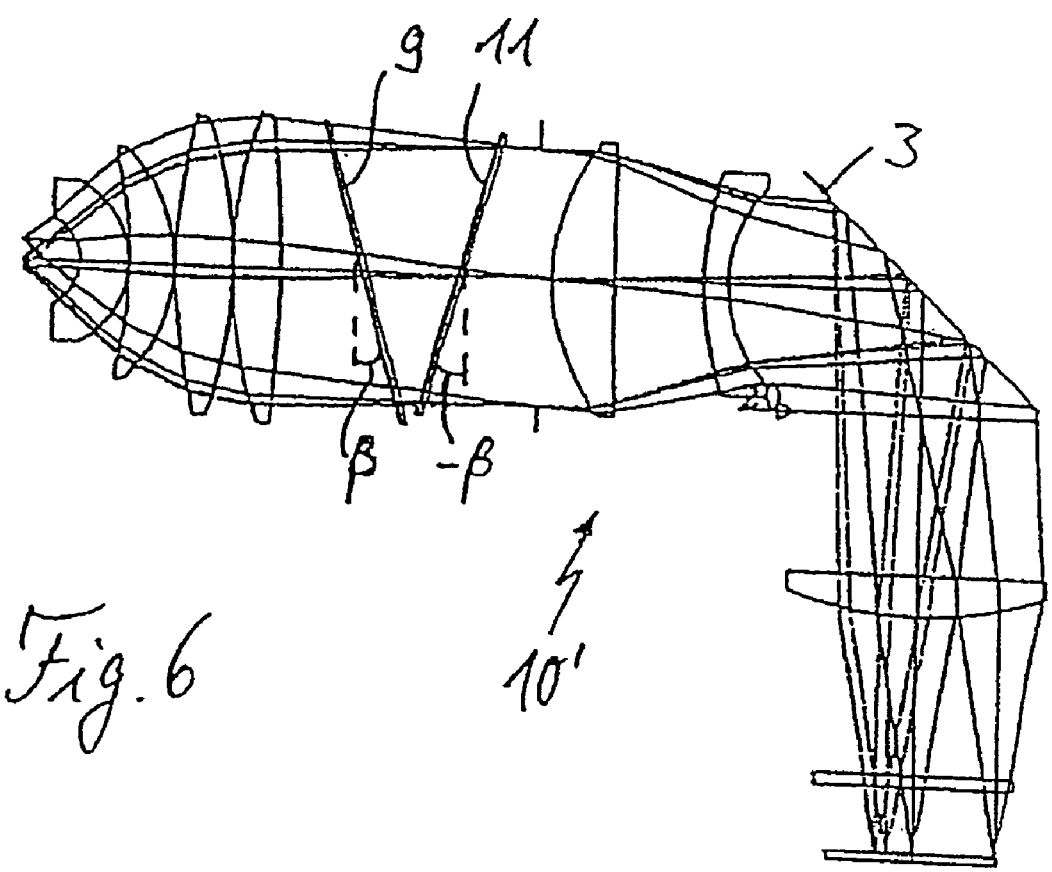
FIG. 6 shows a longitudinal sectional view of another objective for an illuminating system of a microlithographic projection exposure apparatus.

Such an implementation is given in FIG. 6 for the case of the objective of FIG. 2. In addition to the setup of FIG. 2, a second transmission plate 11 is arranged in a fashion tilted in the useful beam path in relation to the plane perpendicular to the optical axis and behind the transmission plate 9, which is arranged with the angle of inclination β, the said second transmission plate being of the same dimension as the first and having an opposite angle of inclination β of the same size. It is preferred in this case to select the transmission plate coating such that moderately large angles of inclination β suffice to enable the two transmission plates 9, 11 to be positioned without impediment one behind the other in the otherwise unchanged objective 10'. In this exemplary embodiment, the two transmission plates 9, 11, which are preferably similarly coated, can contribute to the compensation effect with regard to polarization attenuation.

As the above-described exemplary embodiments make plain, the invention makes available an optical system which supplies a useful light beam which, despite the presence of one or more deflecting mirrors or other optical components which attenuate two different linear polarization states differently, supplies at the output end a useful light beam in which the light fractions of the two linear polarization states bear a desired relationship to one another, preferably being essentially of the same size. Provided for this purpose is a compensation unit having at least one transmission plate which is introduced obliquely into the beam path and completely or partially compensates this behaviour of the remaining part of the optical system.

The intensity ratio of the useful light fractions of the two linear polarization states can be set to a desired value by selecting the material and the angle of inclination of the transmission plate and by using an optimum coating. The transmission plate is preferably inclined about an axis parallel to the tilting axis of the respective deflecting mirror. It is still possible during operation to carry out fine setting of the compensation effect by appropriate variation of the angle of inclination. During use in imaging systems, it is advantageous to position the transmission plate in a plane conjugate to the plane of a deflecting mirror. Different incidence angle distributions for the respective deflecting mirror, on the one hand, and the transmission plate, on the other hand, can, if required, be compensated completely or partially by a coating which is variable over the irradiated plate surface as a function of location. During use in imaging systems, possible asymmetric aberrations caused by the transmission plate can be compensated by arranging a similar second transmission plate with an opposite angle of inclination of the same size.

It is possible to achieve in this way, for objectives with a deflecting mirror such as are used in an illuminating system and as a projection objective in microlithographic exposure apparatuses, that there is available in the mask plane and, in particular, in the wafer plane light whose s-polarized component and p-polarized component are present at substantially the same intensity. In particular, with the aid of this measure it is also possible to achieve compensation for systems with an odd number of deflecting mirrors, and for systems in which a plurality of deflecting mirrors with a common incidence plane, that is to say parallel tilting axes, are arranged. It goes without saying that the invention can be used not only for microlithographic projection exposure apparatuses, but also for any other optical systems which provide a useful light beam by using one or more optical components which attenuate two different linear polarization states of the useful light beam in a different way.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

I claim:

1. An optical system for providing a useful light beam, comprising
   at least one optical component which attenuates a useful light fraction with a first linear polarization state less strongly than a useful light fraction with a second linear polarization state different from the first linear polarization state, and a compensation unit having a transmission plate which is introduced into the useful light beam path inclined to the plane perpendicular to the optical axis by a prescribed angle of inclination, and attenuates the useful light fraction with the first linear polarization state more strongly than the useful light fraction with the second linear polarization state.

2. The optical system according to claim 1, wherein the transmission plate comprises a transparent plane plate with a transmitting coating which attenuates the useful light fraction with the first linear polarization state to an extent dependent on an incidence angle of the light more strongly than the useful light fraction with the second linear polarization state.

3. The optical system according to claim 1, further comprising at least one deflecting mirror, wherein at least one of an angle of inclination and a transmitting coating of the transmission plate is selected as a function of a magnitude of an imbalance, caused by the at least one deflecting mirror, of the intensity of the two useful light fractions.

4. The optical system according to claim 3, further comprising a measuring device for determining the polarization degree downstream of the at least one deflecting mirror, wherein the at least one of the angle of inclination and the coating of the transmission plate is set as a function of the intensity, measured by the measuring device, of the two useful light fractions.

5. The optical system according to claim 3, further comprising an imaging system, wherein the transmission plate and the at least one deflecting mirror is arranged in planes of the imaging system that are at least approximately conjugate to one another.

6. The optical system according to claim 3, wherein the coating is applied to the transmission plate variably depending on location as a function of an incidence angle distribution of the useful light incident on the deflecting mirror.

7. The optical system according to claim 1, configured as an imaging system, wherein the compensation unit comprises a further transmission plate, which is introduced into the useful light beam path with reference to the plane perpendicular to the optical axis and inclined by an angle of inclination which is opposite to the prescribed angle of inclination of the first transmission plate.

* * * * *